United States Patent [19]

Jochems

[11] 4,343,079
[45] Aug. 10, 1982

[54] SELF-REGISTERING METHOD OF MANUFACTURING AN INSULATED GATE FIELD-EFFECT TRANSISTOR

[75] Inventor: Pieter J. W. Jochems, Eindhoven, Netherlands

[73] Assignee: U.S. Philips Corporation, New York, N.Y.

[21] Appl. No.: 141,510

[22] Filed: Apr. 18, 1980

[30] Foreign Application Priority Data

Apr. 23, 1979 [NL] Netherlands .................. 7903158

[51] Int. Cl.³ ............................................ H01L 21/26
[52] U.S. Cl. ............................. 29/571; 29/576 W; 148/187
[58] Field of Search ............ 29/571, 576 W; 148/187, 148/1.5

[56] References Cited

U.S. PATENT DOCUMENTS

| 4,023,195 | 5/1977 | Richman | 148/187 X |
| 4,043,848 | 8/1977 | Bazin | 148/187 |
| 4,101,344 | 7/1978 | Kooi et al. | 148/187 X |
| 4,168,999 | 9/1979 | Vora et al. | 148/1.5 X |
| 4,268,950 | 5/1981 | Chatterjee et al. | 29/571 |

Primary Examiner—G. Ozaki

Attorney, Agent, or Firm—Thomas A. Briody; Robert T. Mayer; Steven R. Biren

[57] ABSTRACT

A method of manufacturing an IGFET device in an entirely self-registering manner, in which on the semiconductor body a narrow silicon nitride strip is formed which covers only the active region of the body and the width of which is substantially equal to that of the transistors to be manufactured and possibly other circuit elements. This nitride strip is used as a mask for providing the channel stopper zone and as an oxidation mask for providing a first oxide layer. The nitride strip is then etched in which the strip is locally removed over its entire width and only parts remain above the channel region and contact regions which form a second oxidation mask and, in cooperation with the first oxide layer, a doping mask. The source and drain zones of the transistors and possibly further zones, for example underpasses, are formed via said doping mask after which by oxidation a sunken oxide pattern is formed over the whole surface with the exception of the channel regions and the contact regions. After the oxidation the remaining nitride may be removed by means of a maskless etching treatment after which the gate dielectric with the gate electrodes can be provided in a simple manner above the channel regions and the contacts, possibly preceded by the provision of contact zones, can be provided in the contact regions.

8 Claims, 11 Drawing Figures

SELF-REGISTERING METHOD OF MANUFACTURING AN INSULATED GATE FIELD-EFFECT TRANSISTOR

BACKGROUND OF THE INVENTION

The invention relates to a method of manufacturing an insulated gate field-effect transistor in an entirely self-registering manner, in which a silicon body of which at least a surface-adjoining sub-region is of one conductivity type is provided with a number of surface zones of the second conductivity type while using a masking layer of a material different from silicon oxide which masks the underlying material of the semiconductor body against oxidation, from which zones the source and drain zone of the transistor are formed, and there is then provided, by means of an oxidation treatment, with an oxide pattern which is sunk in the silicon body at least over a part of its thickness and which extends above the surface zones and above the adjoining parts of the silicon body and which has a number of apertures which define mesa-shaped regions of the semiconductor body which form the channel region of the transistor and contact regions of the zones which in the mesa-shaped regions adjoin the surface of the body beside the sunken oxide pattern.

In manufacturing field-effect transistors it is conventional to provide the source and drain zones and the insulated gate electrode in a self-registering manner with respect to each other. In fact, such a process offers very important advantages; the transistors obtained in this manner can be small because only small alignment tolerances need be observed, while the high-frequency properties will generally be good as a result of the small stray overlap capacitances between the gate electrode and the source and drain zones.

In a very frequently used MOST process, the source and drain zones are diffused in the semiconductor body while using the gate electrode as a mask. The gate electrode usually consists of polycrystalline silicon.

However, this method has the disadvantage that the channel length of the transistor—the distance between the source and drain zones—is determined entirely by the precision with which a mask pattern can be copied in a photolacquer layer by means of the usual photo-etching methods, and the accuracy with which the pattern in the photolacquer layer can then be etched in the polycrystalline material. This accuracy is often smaller than would be desired. In addition, these critical steps usually take place in a stage in which the surface of the semiconductor body is no longer flat but is strongly profiled as a result of the field oxide already provided around the active regions, which also restricts the smallest dimension which can be made in a reproducible manner.

U.S. Pat. No. 4,023,195 discloses an insulated gate field effect transistor in which the surface of the semiconductor body is covered with an oxide pattern which is sunk in the semiconductor body over a part of its thickness and which has apertures defining in the semiconductor body a number of mesas which form the channel region and contact regions of the source and drain zones of the transistor and in which the source and drain zones are situated entirely below the sunken oxide pattern except at the location of the mesas. Outside the channel region, the gate electrode may extend to above the sunken oxide pattern and to above the source and drain zones, since due to the thickness of the sunken oxide pattern the stray overlap capacitance between the source and drain zones on the one hand and the parts of the gate electrode situated on the sunken oxide pattern on the other hand are comparatively small. During the manufacture of this known transistor, the provision of the gate electrode will therefore require no critical alignment steps. On the contrary, the provision of the sunken oxide pattern according to the method described in this patent will require a critical alignment step with respect to the source and drain zones already provided in the semiconductor body, because the oxidation mask and the diffusion mask for which different masking layers are used are not self-registering. As a result of this, alignment tolerances must be observed in these known transistors which restricts the smallest dimension which can be made in a reproducible manner.

In particular when the transistor is of the n-conductivity type, in which the source and drain zones are of the n-type and the semiconductor body is of the p-type, it is desired to provide below the sunken oxide pattern beside the transistor a channel-stopping p-zone having a higher doping concentration than that of the semiconductor body so as to prevent parasitic channeling below the sunken oxide which, for example in the case in which the transistor forms part of an integrated circuit, can produce undesired connections between various circuit elements. In the manner described in the above-mentioned U.S. patent, such a channel stopping zone is obtained by means of implantation of a suitable impurity while using a separate photolacquer layer as an implantation mask. Often, however, it is desirable, both in connection with the simplicity of the process and in connection with the compactness of the semiconductor device to be manufactured, to also provide the channel-stopping zone in a self-registering manner with respect to the other zones to be provided.

A method in which the sunken oxide pattern and the source and drain zones are provided partially in a self-registering manner, namely in the direction from the source to the drain zone, by using the nitride layer masking against oxidation also as a doping mask, is disclosed in U.S. Pat. No. 4,043,848.

In this method, first windows are provided in the nitride layer via which windows doped zones are provided in the semiconductor body so as to obtain the source and drain zone of the transistor. After this doping step, the nitride layer is removed by etching to such an extent that only nitride spots remain above the channel region of the transistor and above the contact regions of the source and drain regions, after which the sunken oxide pattern is provided using said nitride spots as an oxidation mask by means of thermal oxidation.

Therefore, the nitride mask above the channel region is not fully self-registering with respect to the already-defined source and drain zone of the transistor, as it is not self-registering in the direction transverse to the current direction. Often, and in particular with very small dimensions and large packing densities, a complete self-registration would be desirable. Moreover, in this known process no channel-stopping zone is used. Such a channel-stopping zone is often desired and is preferably also provided in a self-registering manner with respect to the other parts to be provided of the devices to be manufactured.

A similar method in which, however, a channel-stopping zone is provided below the sunken oxide pattern is disclosed in Netherlands Patent Application No.

7704636 (laid open to public inspection). In this known method, first diffusion windows for the source and drain zone are formed in the nitride layer; then, after the diffusion treatment, a mask having an aperture surrounding said diffusion windows for the channel stopping zone is provided. This method is also non-self-registering.

SUMMARY OF THE INVENTION

One of the objects of the invention is to provide a method of the kind described above which is substantially entirely self-registering and with which consequently semiconductor structures of very small dimensions and large density can be obtained in a reproducible manner.

According to the invention, such a method is characterized in that, before forming the surface zones, a first mask in the form of a strip is formed from the said masking layer and covers the surface parts of the semiconductor body where the surface zones, the contact regions and the channel regions are formed and does not cover the said adjoining parts of the semiconductor body, and that, while using said first mask as a doping mask, a doping of one conductivity type is provided in the adjoining parts of the semiconductor body and, while using the same mask as an oxidation mask, a first oxide layer is formed on the adjoining parts, after which the first mask is subjected to a selective etching treatment in which parts of the first mask extending transversely over the whole width of the strip are removed at the area of the surface zones to be provided and a second mask is obtained from the first mask and covers the channel region of the transistor and the contact regions of the zones and which together with the first silicon oxide layer forms a third mask with windows above parts of the semiconductor body where the surface zones are provided, after which an impurity of the second conductivity type is provided in the exposed parts of the semiconductor body via the said windows after which the sunken oxide pattern is provided by means of an oxidation treatment in which the semiconductor body is locally masked against oxidation by the second mask, the impurities of the second and first conductivity types provided in the semiconductor body diffusing further into the semiconductor body and the said surface zones of the second conductivity type and the adjoining parts of the semiconductor body, respectively, forming channel stopping zones of the same conductivity type as the semiconductor body and with a higher doping concentration, after which the remaining parts of the masking layer masking against oxidation and forming the second mask are removed entirely and an insulated gate electrode of the field effect transistor and contacts for the surface zones are provided in the thus-exposed apertures in the sunken oxide pattern.

So in this method, first, the nitride layer is used as a mask for the channel-stopping zone, then as a mask for the source and drain zones of the transistor, and finally as an oxidation mask. The mask for the channel stopping zone is provided in the form of a strip the width of which also defines the width of the transistor. This mask is used as a doping mask for the channel stopping zone and as an oxidation mask for the formation of the oxide layer beside or around the mask.

This oxide layer can be obtained by means of a light thermal oxidation treatment. In a subsequent stage, apertures are provided in the nitride strip which define the source and drain zones with the channel region still covered by nitride. A critical alignment step is not required for providing said apertures (diffusion or implantation windows), since these apertures are allowed to extend over the whole width of the strip and are bounded laterally by said oxide layer. After the doping step the sunken oxide pattern is provided while using the same nitride mask. This whole process is therefore substantially entirely self-registering without critical aligning steps. As a result of this the process is particularly simple and permits small dimensions for the various elements and, in the case of an integrated circuit, a high packing density.

An important embodiment of a method according to the invention is characterized in that further circuit elements are provided in the semiconductor body in which further surface zones of the second conductivity type forming conductive connections between various circuit elements are provided simultaneously with the surface zones forming the source and drain zone of the field effect transistor.

This embodiment is of particular importance in manufacturing complex integrated circuits in which the circuit elements are mutually interconnected by connection patterns at different levels. In the present method, the provision of the lower level in the form of a pattern of zones of the second conductivity type does not require any extra process steps and moreover occurs in a self-registering manner. Since furthermore this connection pattern is entirely buried below the comparatively dense sunken oxide pattern, further conductive connections crossing the zones below the sunken oxide pattern can be provided on the sunken oxide pattern because as a result of the comparatively large thickness of the oxide the stray capacitances are comparatively small.

For performing the method according to the invention, the starting material may be an n-type body in which the source and drain zones are provided as p-type zones. A preferred embodiment is characterized in that a semiconductor body of p-type silicon is used and that the surface zones are doped with an n-type impurity selected from the group consisting of As and Sb. The use of these impurities has the advantage that as a result of the comparatively low diffusion rate as compared with, for example, phosphorus or boron, shallow zones and hence small stray overlap capacitances are obtained between said zones and the insulated gate electrode.

After providing the sunken oxide pattern, the nitride layer masking against oxidation can be removed by means of a maskless etching treatment after which a thin oxide layer may be formed as a gate dielectric above the channel region. The contact mesas, as will become apparent from the description of the figures, are liberated by means of a simple etching treatment using a noncritical mask. The apertures in this mask are allowed to be larger than the contact mesas since as a result of the self-registering effect contact apertures of equal size to that of the contact mesas are nevertheless obtained, which is a great advantage, especially in the case of very small dimensions. Contacts may then be formed.

BRIEF DESCRIPTION OF THE DRAWING

The invention will be described in greater detail with reference to an embodiment and the accompanying diagrammatic drawing, in which.

DETAILED DESCRIPTION

Figure 1:
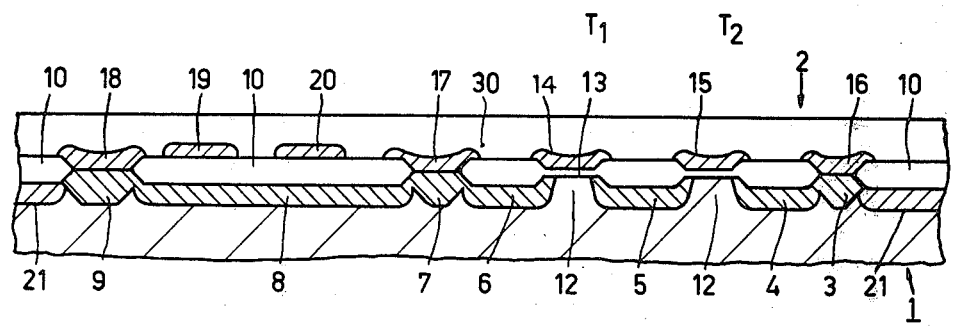
FIG. 1 is a sectional view of a part of a semiconductor device having a transistor manufactured by using a method according to the invention.
Figure 2:
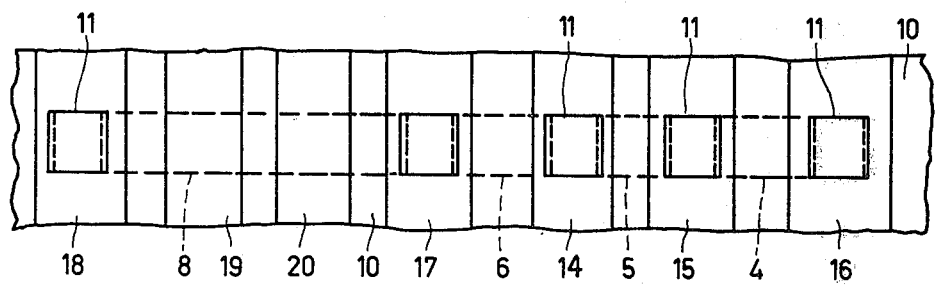
FIG. 2 is a plan view of the device shown in FIG. 1.

Although the invention may also be used advantageously for the manufacture of discrete field effect transistors, the manufacture of an integrated circuit having several such transistors will be described in the following embodiment. Because it is desired to be able to accommodate a maximum number of circuit elements per volume unit or surface unit of the semiconductor body, in particular in complex integrated circuits, the present invention, by means of which circuit elements can be manufactured entirely or at least substantially entirely in a self-registering manner, presents particular advantages for such complex integrated circuits. By way of illustration of the invention, FIGS. 1 and 2 show a device which, by way of example, comprises only two insulated gate field effect transistors, a so-called diffused underpass, and a number of conductor tracks crossing the underpass. In practical constructions, of course, the number of elements will be much larger, but for illustration of the principles of the invention the embodiment shown will suffice.

The device comprises a semiconductor body 1 of silicon which in the embodiment to be described is substantially entirely of a first conductivity type but which, of course, may also have another configuration in which only one surface region, in which the elements shown are provided, is of the first conductivity type and is bounded within the semiconductor body by parts of the second, opposite, conductivity type. The body 1 is provided at its surface 2 with a number of surface zones 3–9 of the second conductivity type forming the source and drain zones of the field effect transistors $T_1$ and $T_2$, a diffused underpass, and contact zones, and is provided with a pattern 10 of silicon oxide which is sunk in the body 1 over a part of its thickness. The pattern 10, for the provision of which use may be made of the same masking layer as for providing the zones 4, 5, 6 and 8, as will become apparent hereinafter, extends above the surface zones 4, 5, 6 and 8 and above adjoining nonactive regions of the semiconductor body. For this reason, said zones are shown in broken lines in the plan view of FIG. 2.

As shown in FIG. 2, the sunken oxide pattern 10 extends over substantially the whole surface and shows only a number of comparatively small apertures 11 which define mesa-shaped regions 12 (hereinafter termed mesas, see FIG. 1). At the area of said mesas (which define the channel regions of the transistors $T_1$ and $T_2$ and contact regions 3, 7 and 9) the n-type zones 4, 6 and 8 emerge from below the sunken oxide pattern 10 to the surface 2 of the semiconductor body. Above the mesas which form the channel regions of the transistors $T_1$, $T_2$, a thin silicon oxide layer 13 is provided as a gate dielectric. The gate electrodes 14, 15 of the transistors are present on the layer 13. The zones of the transistors and said gate electrodes are separated from each other by the pattern 10. As a result of the comparatively large thickness of the pattern 10, the stray capacitance between the gates 14, 15 and the underlying zones is comparatively small so that the provision of the gates does not require an accurate aligning step.

By way of example, the transistors comprise as a main electrode region a common zone 5 situated substantially entirely below the pattern 10. The other main electrode regions of the transistors, formed by the zones 4 and 6, are connected, via the n-type contact zones 3 and 7, respectively, provided in the contact mesas 12, to the contacts or the conductor strips 16 and 17, respectively. The contact 17 also forms a connection of the diffused underpass 8 which is connected to the contact 18 on the other side via a zone 9 of the second conductivity type. Two conductor tracks 19 and 20 are shown on the oxide pattern 10 and cross the underpass 8 and are separated herefrom by the comparatively thick oxide layer 10. The contacts and conductor tracks 14–20 may be connected to further circuit elements not shown in the figures.

As may further be seen from FIG. 1, a zone 21 which has the same conductivity type as (but a higher doping concentration than) the semiconductor body 1, is present in the semiconductor body 1 below the sunken oxide pattern 10 and outside the active region of the circuit (this is the region in which circuit elements and diffused connections are situated). As is known, the formation of stray channels below the sunken oxide pattern 10 which can produce undesired connections between the circuit elements can be prevented by means of such a more highly doped zone.

In the present embodiment, the manufacture will be described of a semiconductor device having field effect transistors of the n-channel type, but, of course, the principles of the manufacturing process can also be applied to devices of the p-channel type. However, due to several advantages to be mentioned hereinafter, devices of the n-channel type are to be preferred over those of the p-channel type.

Figure 3:
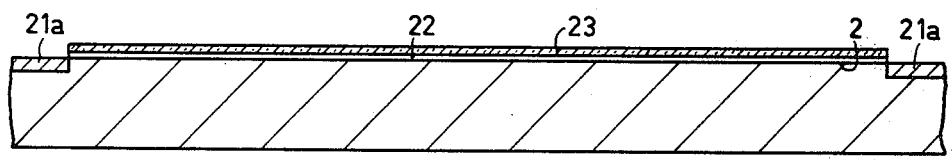
FIGS. 3 to 11 are plan views and sectional views of the device shown in FIGS. 1 and 2 during a number of stages of manufacture.

Starting material for the manufacture of the device shown in FIGS. 1 and 2 is a semiconductor body 1 of p-type silicon having a usual resistivity of approximately 6–8 Ohm·cm and a thickness of approximately 300 to 400 μm (FIG. 3).

By means of thermal oxidation the surface 2 is covered with a comparatively thin layer 22 of silicon oxide in a thickness of approximately 500 Å. By passing a mixture of $NH_3$ and $SiCl_4$ over the semiconductor body 1 at a temperature of approximately 800° C., a layer of silicon nitride is deposited on the silicon oxide layer 22 in a thickness of approximately 1500 Å. A first mask in the form of a strip 23 is formed from said layer by means of photolithographic etching. This strip, which in the present example is entirely straight but may also have another configuration, for example a curve, only covers that part of the body 1 in which the circuit elements, such as the transistors $T_1$, $T_2$, contact zones and the underpass 8 will be provided in a later stage of the process.

An important matter which is to be noticed is that the dimensions of the circuit elements $T_1$ and $T_2$ to be manufactured of the contact zones and of the underpass 8 are defined in one direction already in this stage of the process, namely by the width of the strip 23, as will become apparent hereinafter.

The mask 23 can be obtained in known manner, for example, by passing water vapor over the nitride layer at a temperature of approximately 1100° C. so that a thin layer of silicon oxide is formed on the nitride. An etching mask consisting of a photolacquer layer may be provided on said oxide layer, by means of which the strip 23 is then formed from the nitride layer by plasma etching. The photolacquer layer may then be removed.

Figure 4:
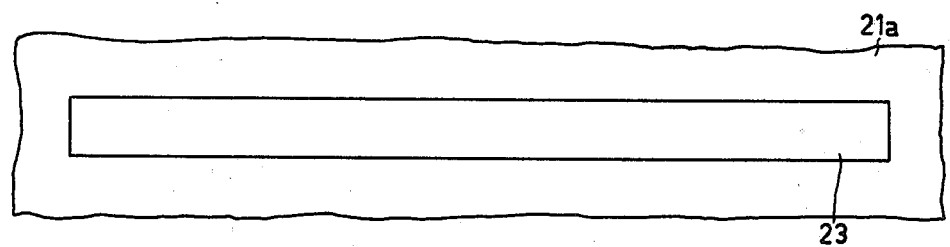

Using the silicon nitride strip 23 as an etching mask, the oxide layer 22 is then subjected to an etching treatment so that the surface parts of the semiconductor body around the strip 23 surrounding the active regions become exposed (FIGS. 3, 4). By diffusion or implantation of boron atoms the zone 21a is then provided in said exposed parts, from which zone the channel stopping zone 21 will be formed after providing the sunken oxide pattern 10. The zones 21, 21a are aligned accurately (with respect to the active regions of the semiconductor body) and are defined by the strip or strips 23.

Figure 5:
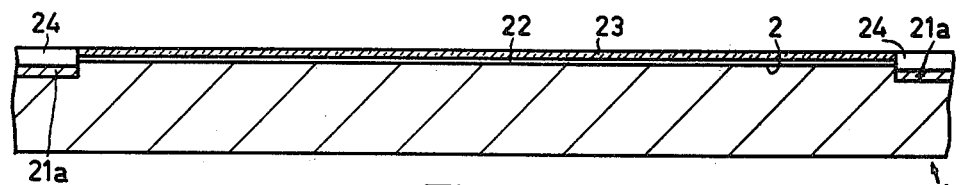
Figure 6:
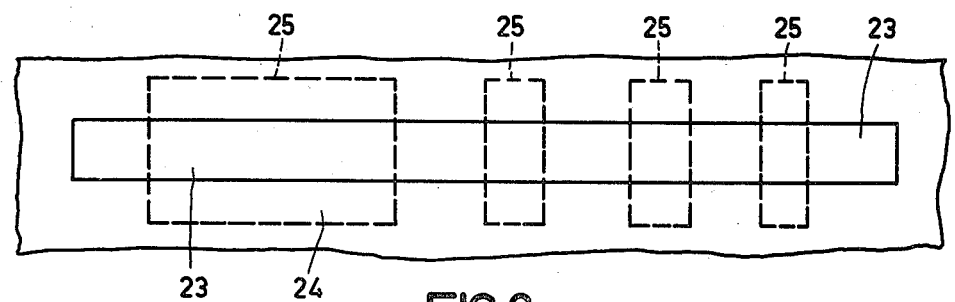

During the formation of the zones 21a a boron-containing glass layer may be formed on the surface 2 of the semiconductor body 1. This layer may be removed again by means of a maskless etching treatment, after which the semiconductor body is subjected to an oxidation treatment for approximately 35 minutes at a temperature of approximately 1000° C., the semiconductor body being masked locally against oxidation by the nitride strip 23. As a result of this oxidation treatment, the exposed surface parts of the semiconductor body around the nitride strip 23 are closed again by a layer 24 of silicon oxide having a thickness of approximately 0.3 μm, see FIG. 5. The device is then covered with a layer of photolacquer in which windows are provided in known manner via which the silicon nitride layer can be subjected to a masked etching treatment. The provision of said windows 25, shown in broken lines in the plan view of FIG. 6, does not require a critical alignment step in spite of the very small width of the nitride strip 23, since the windows 25, as shown in FIG. 6, may project beyond the nitride strip 23 on either side of the nitride strip to above the oxide layer 24.

The parts of the nitride strip 23 exposed in the windows 25 are then removed, for example, by means of plasma etching. This etching treatment may be done selectively so that the silicon oxide of the layer 24 also exposed in the windows 25 is not attacked or is attacked at least to a much smaller extent than the silicon nitride.

After etching the nitride, the photomask may be removed. The exposed parts of the thin silicon oxide layer 22 which had been grown on the surface 2 prior to the nitride, can be removed by means of a maskless etching treatment. Although in this case a part of the oxide layer 24 is also removed, this will not be a disadvantage because the layer 24 is many times thicker than the layer 22 and the masking properties of the layer 24 are hardly apt to be influenced detrimentally as a result of a small reduction of the thickness.

Figure 7:
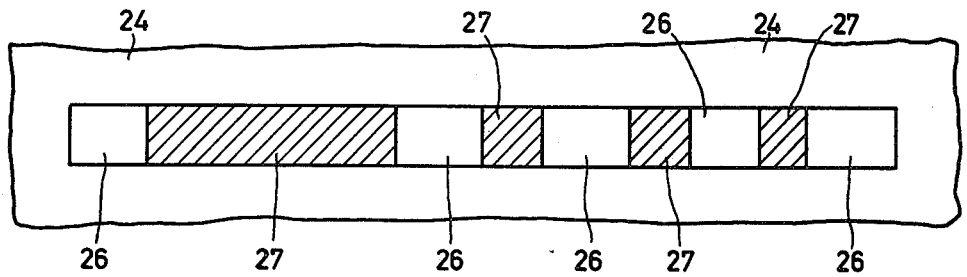

A second mask is now formed from the silicon nitride layer which, as shown in the plan view of FIG. 7, comprises a number of regions 26. The second nitride mask formed of regions 26 together with the silicon oxide layer 24 forms a third mask which covers the greater part of the surface and has apertures 27 which are shown shaded in the plan view of FIG. 7. It is to be noted that by means of the same photolacquer layer mask simultaneously two masks are obtained, namely a doping mask 24, 26 and an oxidation mask 26.

Figure 8:
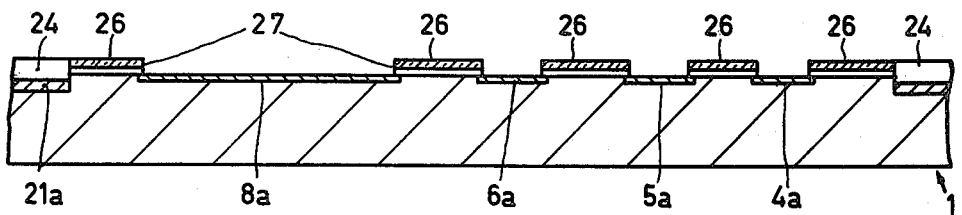

An impurity, in this case arsenic, is introduced into the semiconductor body via the windows 27 in a dose of approximately $10^{15}/cm^2$, for example by means of ion implantation, so that the n-type zones 4a, 5a, 6a, and 8a are obtained. FIG. 8 is a sectional view of the device in this stage of the process.

Figure 9:
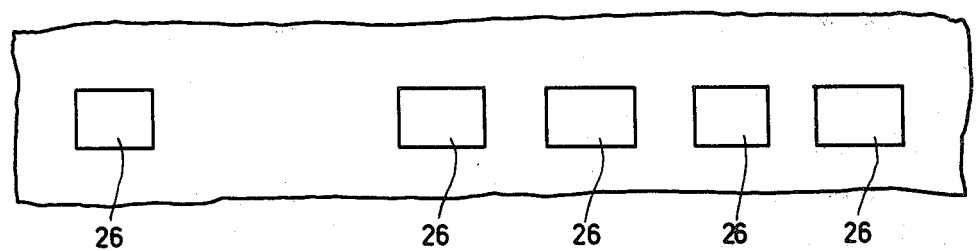

Before providing the sunken oxide pattern 10, the first oxide layer 24 is removed in a subsequent step by means of a selective maskless etching treatment in which the silicon nitride is substantially not attacked. This step is not necessary but is preferably carried out so as to obtain a sunken oxide pattern 10 having a thickness which is as uniform as possible. After this etching treatment, only the oxidation mask is present on the surface 2 and is formed by the silicon nitride spots 26 as shown in the plan view of FIG. 9. The semiconductor body is then subjected to an annealing treatment for approximately 30 minutes at a temperature of approximately 750° C. so as to remove the damage done during the ion implantation to the crystal structure of the silicon.

Figure 10:
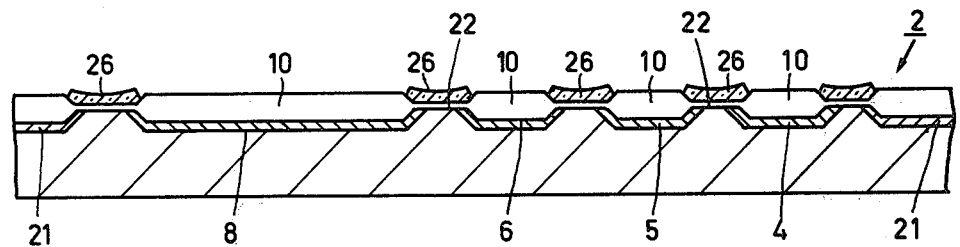

The oxidation pattern 10 may be provided by oxidation of the surface parts not masked by the nitride 26. The oxidation is carried out in an oxygen-containing medium at a temperature of approximately 1100° C. until the thickness of the oxide is approximately 2 μm. During this oxidation the As impurity diffuses deeper into the semiconductor body and, as shown in the sectional view of FIG. 10, forms the n-type zones 4–6 and 8 below the sunken oxide pattern 10. The thickness of these zones in the given circumstances is between approximately 0.5–1 μm. It is to be noted that the diffusion constant of As is monocrystalline silicon is comparatively low. It has surprisingly been found, however, that with a suitable choice of dopant concentration and/or temperature the diffusion of As atoms in the semiconductor body nevertheless occurs so much more rapidly than the oxidation rate that n-type zones can be obtained which show a sufficiently low resistivity and which extend laterally along the edges of the oxide pattern up to the surface of the mesas 12. Measurements have demonstrated that the sheet resistance of the zones 4–6, 8 is approximately 74 Ohms, which is sufficiently low for many applications. The depth of the zones 4–6, 8 from the edge of the sunken oxide pattern 10 is approximately 0.5–1 μm. This depth, which is very small as compared with, for example, zones which, under otherwise equal circumstances, are doped with P or with p-type impurities, for example B, has important advantages, inter alia a small stray capacitance between the insulated gate electrodes and the zones. In addition, as a result of this, extra small and compact structures can be obtained.

During the oxidation the B atoms provided in the zones 21a also diffuse deeper into the semiconductor body 1 and below the oxide pattern from the channel stopping zones 21.

After the oxidation treatment the remaining parts 26 of the silicon nitride layer are removed by means of a selective etching treatment.

The now-exposed parts of the silicon oxide layer 22 may be used as a gate insulation at the area of the gate electrodes still to be provided. Preferably, however, the oxide layer 22 is removed by means of a maskless etching treatment. During this treatment a thin layer of the oxide pattern 10 will also be removed but this need not be any disadvantage because said removed layer will be very much thinner than the pattern 10.

Figure 11:
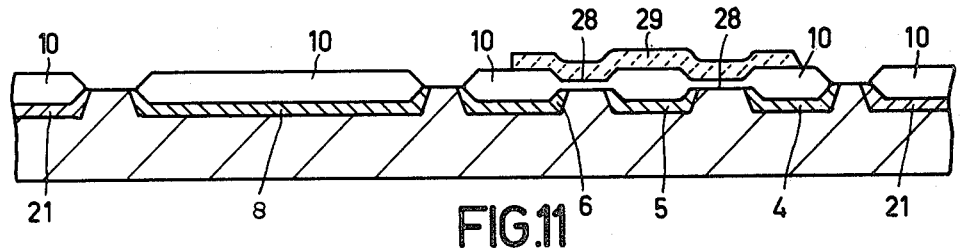

By thermal oxidation, the gate dielectric is then provided in the mesas in the form of a fresh oxide layer 28 (see sectional view FIG. 11) in a thickness of, for example, 800 Å. At the area of the contact mesas, said oxide layer is again removed by means of a so-called dip etch in which simultaneously a thin layer can again be removed locally from the sunken oxide pattern 10 without adversely influencing the properties of said pattern. The mesas at the area of the channel regions of the transistors are masked during said etching treatment by a photo-lacquer layer 29. The provision of the mask 29 which is allowed to extend to above the sunken oxide pattern does not require any critical alignment step. After the local etching away of the layer 28, the insulated gate electrodes 14, 15 and the contacts 16, 18 may then be provided above the mesas 12 by means of deposition and then etching of a suitable conductor material. The conductors 19 and 20 crossing the underpass 8 may also be formed simultaneously. As a conductor material there may be used, for example, doped polycrystalline silicon, a known, generally-used material in the manufacture of insulated gate field effect transistors. The previously provided contact zones 3, 7, 9 may be omitted, if desired. The gate electrode 14, and contacts 16, 17 may then form ohmic contacts with the n-type zones 4, 6 and 8 which form p-n junctions with the p-type substrate which also adjoins the surface 2 in the mesas 12. The polycrystalline silicon may also be intrinsic (undoped) during the deposition and afterwards be n-type doped to reduce its resistance, the impurity at the area of the contacts diffusing in the semiconductor body via the polycrystalline material. In an alternative embodiment, a metal having a lower resistivity than polycrystalline silicon, for example Al, may be chosen instead of polycrystalline silicon since in the process according to the invention the gate electrodes 14, 15 are not used as a doping mask for providing the source and drain zones of the transistors. In this case, prior to providing the Al, the n-type contact zones 3, 7, 9 must be provided by doping the contact mesas with an n-type impurity, for example phosphorus.

In principle the device is then ready and, if desired, a layer of glass 30 may be provided over the assembly as a passivating layer. The process described is simple and has important advantages since it is entirely or at least substantially entirely self-registering. In particular, the dimensions of the elements may be small and the packing density may be very large. The width of the nitride strip 23 may be carried out with the minimum value achievable by means of available photolithographic methods. A value for this width is, for example, 5 $\mu$m, which, with a 2 $\mu$m thick oxide pattern, results in a width of 3 $\mu$m of the channel regions of the transistors and the diffused zones 4–6, 8.

A further important aspect of the process described resides in the fact that simultaneously with the source and drain zones of the transistor, diffused underpasses 8 can also be formed so that a complete connection layer is obtained. The stray capacitances between the underpass 8 and the conductor tracks 19, 20 are very low due to the thick oxide pattern 10.

It will be obvious that the invention is not restricted to the embodiments described, but that many variations are possible to those skilled in the art without departing from the scope of this invention.

What is claimed is:

1. A method of manufacturing an insulated gate field effect transistor in an entirely self-registering manner, in which a silicon body of which at least a surface-adjoining sub-region is of one conductivity type is provided with a plurality of surface zones of the second conductivity type while using a masking layer of a material differing from silicon oxide which masks the underlying material of the semiconductor body against oxidation, from which zones the source and drain zones of the transistor are formed, and said body is then provided, by means of an oxidation treatment, with an oxide pattern which is sunk in the silicon body over at least a part of its thickness and which extends above the surface zones and above the adjoining parts of the silicon body and which comprises a plurality of apertures which define mesa-shaped regions of the semiconductor body which form the channel region of the transistor and contact regions of the zones which in the mesa-shaped regions adjoin the surface of the body beside the sunken oxide pattern, characterized in that, before forming the surface zones, a first strip-shaped mask is formed from said masking layer and covers the surface parts of the semiconductor body where the surface zones, the contact regions and the channel region are formed and does not cover the adjoining parts of the semiconductor body, and in that, while using said first mask as a doping mask, an impurity of one conductivity type is provided in the adjoining parts of the semiconductor body and said adjoining parts are provided with a first oxide layer while using the same mask as an oxidation mask, after which the first mask is subjected to a selective etching treatment in which parts of the first mask extending transversely over the whole width of the strip are removed at the area of the surface zones to be provided and a second mask is obtained from the first mask which covers the channel region of the transistor and the contact regions of the zones and which together with the first silicon oxide layer forms a third mask with windows above parts of the semiconductor body where the surface zones are provided, after which an impurity of the second conductivity type is provided in the exposed parts of the semiconductor body through said windows, after which the sunken oxide pattern is provided by means of an oxidation treatment in which semiconductor body is locally masked against oxidation by the second mask, said mesa-shaped regions being thereby defined, the impurities of the second and the first conductivity type provided in the semiconductor body diffusing further into the semiconductor body to form, respectively, the surface zones of the second conductivity type comprising the source and drain zones of the transistor and, in the adjoining parts of the semiconductor body, channel stopping zones of the same conductivity type as the semiconductor body and with a higher doping concentration, after which the remaining parts of the masking layer masking against oxidation and forming the second mask are removed entirely and an insulated gate electrode of the field effect transistor and contacts for the surface zones are provided in the apertures thus exposed in the sunken oxide pattern.

2. A method as claimed in claim 1, characterized in that further circuit elements are provided in a semiconductor body and further surface zones of the second conductivity type which form conductive connections between selected further circuit elements are provided in the semiconductor body simultaneously with the provision of said surface zones forming the source and drain zones of the said field effect transistor.

3. A method as claimed in claim 1 or 2, characterized in that said semiconductor body comprise p-type silicon and in that the surface zones are doped with an n-type impurity selected from the group consisting of As and Sb.

4. A method as claimed in claim 3, characterized in that As in a concentration of at least $5 \times 10^{14}$ At/cm$^2$ is used as an impurity.

5. A method as claimed in, claim 1 characterized in that a layer having a thickness of at most approximately 0.5 μm is used as said first silicon oxide layer which is present on the adjoining surface parts of the semiconductor body beside the second mask and said first silicon oxide layer together with the second mask forms the third mask.

6. A method as claimed in claim 5, characterized in that, after providing the impurities in the semiconductor body to obtain the surface zones of the second conductivity type and prior to providing the sunken oxide pattern, said first silicon oxide layer is removed so that the resulting sunken oxide pattern has a substantially uniform thickness.

7. A method as claimed in claim 1, characterized in that after providing the sunken oxide pattern in the mesas at the area of the contact regions of the surface zones, contact zones of the second conductivity type are provided through the apertures in the sunken oxide pattern.

8. A method as claimed in claim 1, characterized in that a layer of silicon nitride is used as a masking layer from which the first and the second mask are formed.

* * * * *

UNITED STATES PATENT AND TRADEMARK OFFICE
CERTIFICATE OF CORRECTION

PATENT NO. : 4,343,079

DATED : August 10, 1982

INVENTOR(S) : Pieter J.W. Jochems

It is certified that error appears in the above—identified patent and that said Letters Patent is hereby corrected as shown below:

Claim 1, column 10, line 36, after which insert --the--

Signed and Sealed this

Fifth Day of October 1982

[SEAL]

Attest:

Attesting Officer

GERALD J. MOSSINGHOFF

Commissioner of Patents and Trademarks